(12) United States Patent
Kabutoya

(10) Patent No.: US 12,389,614 B2
(45) Date of Patent: Aug. 12, 2025

(54) SEMICONDUCTOR DEVICE AND METHOD OF MANUFACTURING SEMICONDUCTOR DEVICE

(71) Applicant: KYOCERA Corporation, Kyoto (JP)

(72) Inventor: Shingo Kabutoya, Tsukuba (JP)

(73) Assignee: KYOCERA Corporation, Kyoto (JP)

( * ) Notice: Subject to any disclaimer, the term of this patent is extended or adjusted under 35 U.S.C. 154(b) by 305 days.

(21) Appl. No.: 17/911,929

(22) PCT Filed: Mar. 18, 2021

(86) PCT No.: PCT/JP2021/011210
§ 371 (c)(1),
(2) Date: Sep. 15, 2022

(87) PCT Pub. No.: WO2021/200238
PCT Pub. Date: Oct. 7, 2021

(65) Prior Publication Data
US 2023/0137811 A1    May 4, 2023

(30) Foreign Application Priority Data
Mar. 31, 2020   (JP) ................................. 2020-062399

(51) Int. Cl.
*H10D 8/01*   (2025.01)
*H01L 21/285*   (2006.01)
*H10D 8/60*   (2025.01)
*H10D 64/64*   (2025.01)

(52) U.S. Cl.
CPC ....... *H10D 8/051* (2025.01); *H01L 21/28537* (2013.01); *H10D 8/605* (2025.01); *H10D 64/64* (2025.01)

(58) Field of Classification Search
CPC .......... H10D 8/051; H10D 8/60; H10D 64/64; H10D 8/605; H10D 62/115; H10D 64/20; H01L 21/28537
See application file for complete search history.

(56) References Cited

U.S. PATENT DOCUMENTS

| 11,271,084 | B2* | 3/2022 | Fukui | ................... | H10D 62/157 |
| 2017/0148927 | A1* | 5/2017 | Yu | ........................ | H10D 62/106 |

FOREIGN PATENT DOCUMENTS

| CN | 104701161 A | * | 6/2015 | ......... H01L 29/0603 |
| CN | 106033781 A | | 10/2016 | |
| CN | 109473470 A | | 3/2019 | |
| JP | 1997-232597 A | | 9/1997 | |
| JP | 2000-150920 A | | 5/2000 | |

(Continued)

*Primary Examiner* — Steven B Gauthier
*Assistant Examiner* — Khatib A Rahman
(74) *Attorney, Agent, or Firm* — Volpe Koenig

(57) ABSTRACT

An insulating film is formed on a front surface of a semiconductor layer in which a trench has been formed. An electric conductor is embedded into the trench, and the insulating film that has been formed on the semiconductor layer surface and that is adjacent to the trench is removed by etching so as to expose the semiconductor layer surface. The semiconductor layer surface is further etched such that the semiconductor layer surface is lowered relative to an upper end of the insulating film covering the inner surface of the trench. After that, a Schottky barrier junction is formed at the semiconductor layer surface.

5 Claims, 8 Drawing Sheets

(56) References Cited

FOREIGN PATENT DOCUMENTS

| | | | |
|---|---|---|---|
| JP | 2000-174293 | A | 6/2000 |
| JP | 2000-323726 | A | 11/2000 |
| JP | 2004-172513 | A | 6/2004 |

\* cited by examiner

SEMICONDUCTOR DEVICE AND METHOD OF MANUFACTURING SEMICONDUCTOR DEVICE

TECHNICAL FIELD

The present disclosure relates to a semiconductor device and a method of manufacturing a semiconductor device.

BACKGROUND OF INVENTION

An example of a semiconductor device of the related art that includes a Schottky barrier junction is described in Japanese Unexamined Patent Application Publication No. 9-232597. In this semiconductor device, an insulating film is formed on a surface of a semiconductor layer in which a trench has been formed, and an electric conductor is embedded into the trench. Then, the insulating film that has been formed on the surface of the semiconductor layer and that is adjacent to the trench is removed by etching in such a manner as to expose the surface of the semiconductor layer, so that a Schottky barrier junction is formed at the surface of the semiconductor layer.

SUMMARY

In an embodiment of the present disclosure, a method of manufacturing a semiconductor device includes forming an insulating film onto a surface of a semiconductor layer in which a trench has been formed, embedding an electric conductor into the trench, removing the insulating film that has been formed on the surface of the semiconductor layer and that is adjacent to the trench by etching in such a manner as to expose the surface of the semiconductor layer, further etching the surface of the semiconductor layer in such a manner that the surface of the semiconductor layer is lowered relative to an upper end of the insulating film covering an inner surface of the trench, and forming a Schottky barrier junction at the surface of the semiconductor layer.

In another embodiment of the present disclosure, a semiconductor device includes a semiconductor layer in which a trench has been formed, an insulating film covering an inner surface of the trench, an electric conductor embedded in the trench covered with the insulating film, and a Schottky barrier layer forming a Schottky barrier junction together with a surface of the semiconductor layer adjacent to the trench. The Schottky barrier junction is positioned lower than an upper end of the insulating film covering the inner surface of the trench.

DESCRIPTION OF EMBODIMENTS

An embodiment of the present disclosure will be described below with reference to the drawings.

A method of manufacturing a semiconductor device will now be described with reference to the drawings.

[Overview of Manufacturing Method]

Figure 1:
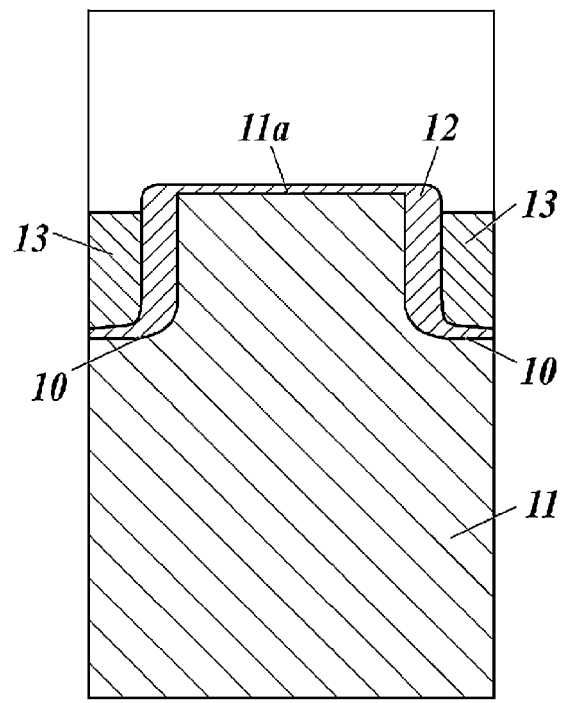
FIG. 1 is a schematic sectional view illustrating a manufacturing process of a semiconductor device according to an embodiment of the present disclosure.

As illustrated in FIG. 1, an insulating film 12 is formed on a surface of a semiconductor layer 11 in which a trench 10 has been formed, and an electric conductor 13 is embedded into the trench 10. For example, polysilicon may be used as the electric conductor 13. The semiconductor layer 11 may be made of, for example, silicon, and the insulating film 12 may be made of, for example, a silicon oxide film.

(Process of Etching Insulating Film)

Figure 2:
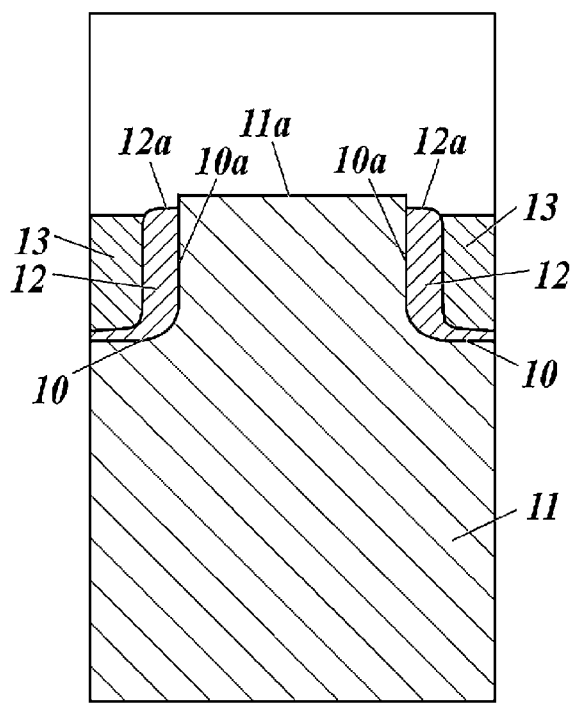
FIG. 2 is a schematic sectional view illustrating a manufacturing process to be performed subsequent to that illustrated in FIG. 1.

Next, the insulating film 12 that has been formed on a semiconductor layer surface 11a and that is adjacent to the trench 10 is removed by etching in such a manner as to expose the semiconductor layer surface 11a as illustrated in FIG. 2. In this case, the insulating film 12 may sometimes be overetched in order to sufficiently expose the semiconductor layer surface 11a, and an upper end 12a of the insulating film 12 covering an inner surface 10a of the trench 10 may sometimes be etched deeper. FIG. 2 illustrates a case where the upper end 12a is located below the semiconductor layer surface 11a. In this case, the insulating film on the semiconductor layer surface 11a is sufficiently removed. Note that, in the descriptions of the semiconductor device and the method of manufacturing the semiconductor device, a downward direction and an upward direction respectively refer to a direction in which the trench 10 extends from the surface of the semiconductor layer 11 and a direction opposite to the downward direction, and these directions do not refer to the vertical direction (the direction of gravity) in the manufacture of the semiconductor device or when the semiconductor device is used.

(Process of Etching Semiconductor Layer Surface)

Figure 3:
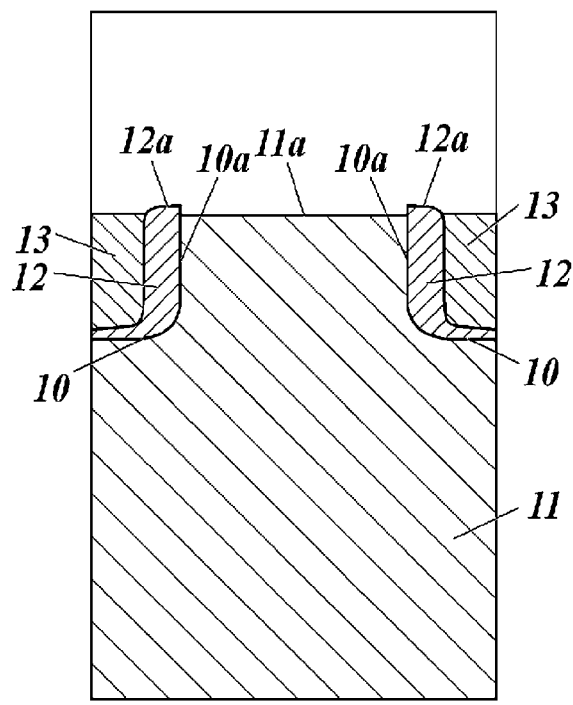
FIG. 3 is a schematic sectional view illustrating a manufacturing process to be performed subsequent to that illustrated in FIG. 2.

Subsequently, as illustrated in FIG. 3, the semiconductor layer surface 11a is etched in such a manner that the semiconductor layer surface 11a is lowered relative to the upper end 12a of the insulating film 12 covering the inner surface 10a of the trench 10. In other words, the position of the semiconductor layer surface 11a becomes lower than the position of the upper end 12a of the insulating film 12 in FIG. 2. Here, the semiconductor layer surface 11a is etched so as to be positioned lower than the upper end 12a of the insulating film 12 as illustrated in FIG. 3. However, the semiconductor layer surface 11a may be etched so as to be located at a predetermined position above the upper end 12a of the insulating film 12 or so as to be located at the same position as the upper end 12a as long as the height of the semiconductor layer surface 11a is reduced with respect to the upper end 12a of the insulating film 12.

(Process of Forming Schottky Barrier Junction)

Figure 4:
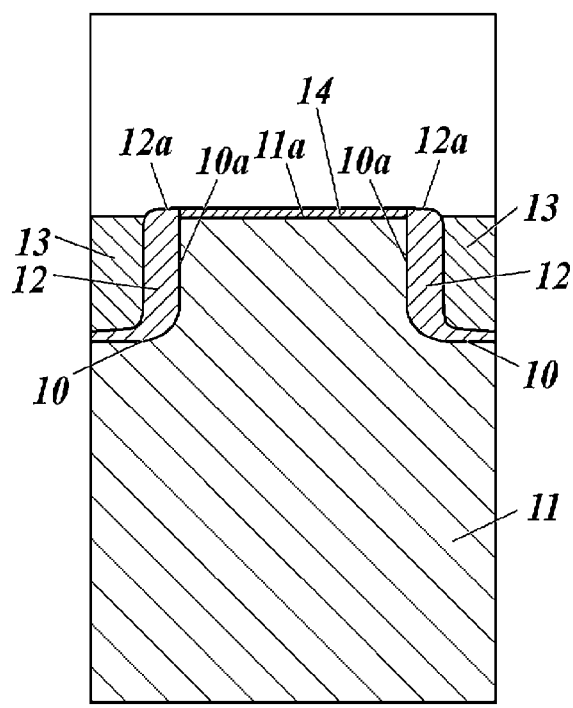
FIG. 4 is a schematic sectional view illustrating a manufacturing process to be performed subsequent to that illustrated in FIG. 3.

After that, a Schottky barrier layer 14 is formed on the semiconductor layer surface 11a as illustrated in FIG. 4 so as to form a Schottky barrier junction. Here, for example, the Schottky barrier layer 14 may be made of nickel silicide or may be made of a metal such as nickel, molybdenum, or platinum.

Subsequently, an upper surface electrode 15 made of aluminum is formed on the metallic layer 14, the electric conductor 13, and the upper end 12a of the insulating film 12. Then, other necessary processes are performed, so that manufacture of the semiconductor device is completed.

[Supplementary Description of Manufacturing Method and Description of Semiconductor Device]

Figure 5:
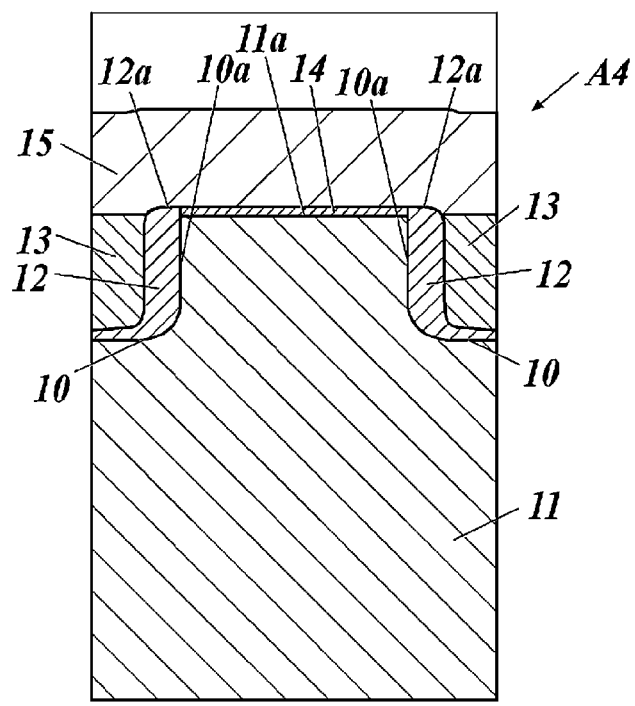
FIG. 5 is a schematic sectional view illustrating a manufacturing process to be performed subsequent to that illustrated in FIG. 4 and illustrating a semiconductor device model A4.
Figure 6:
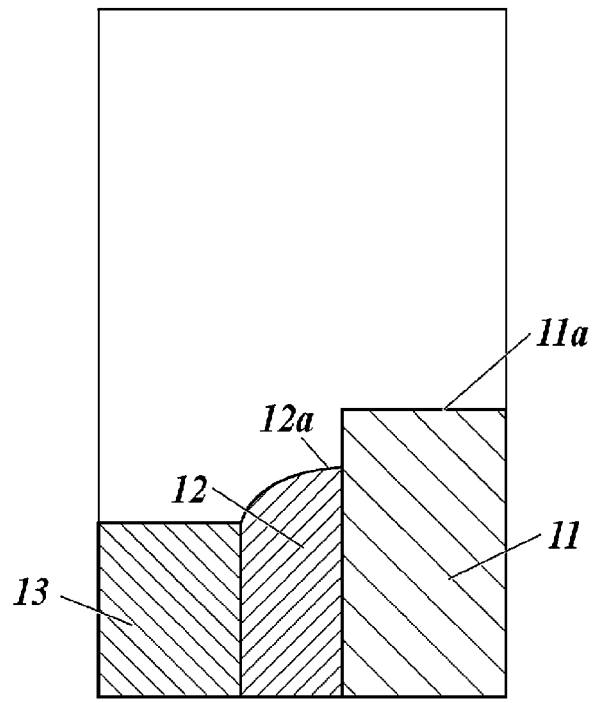
FIG. 6 is an enlarged view corresponding to FIG. 2.
Figure 7:
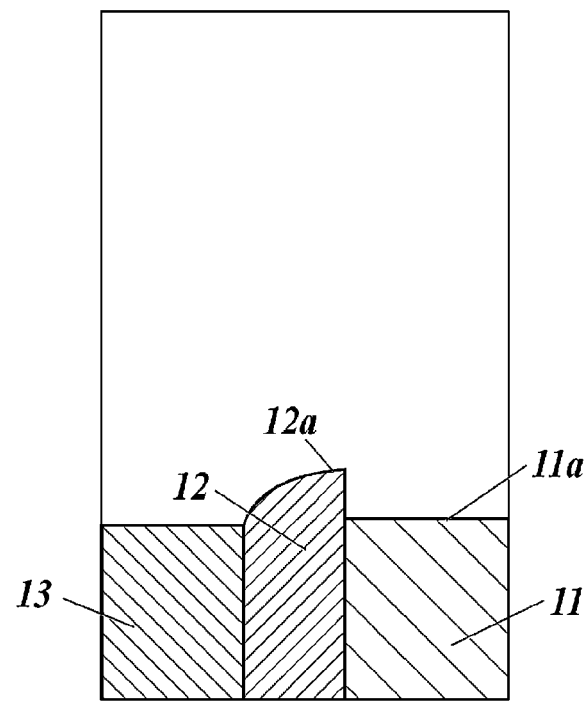
FIG. 7 is an enlarged view corresponding to FIG. 3.
Figure 8:
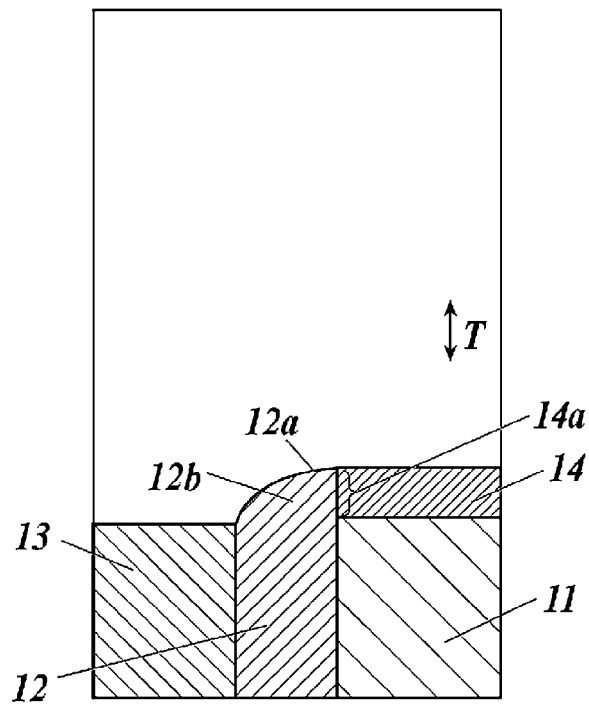
FIG. 8 is an enlarged view corresponding to FIG. 4.
Figure 9:
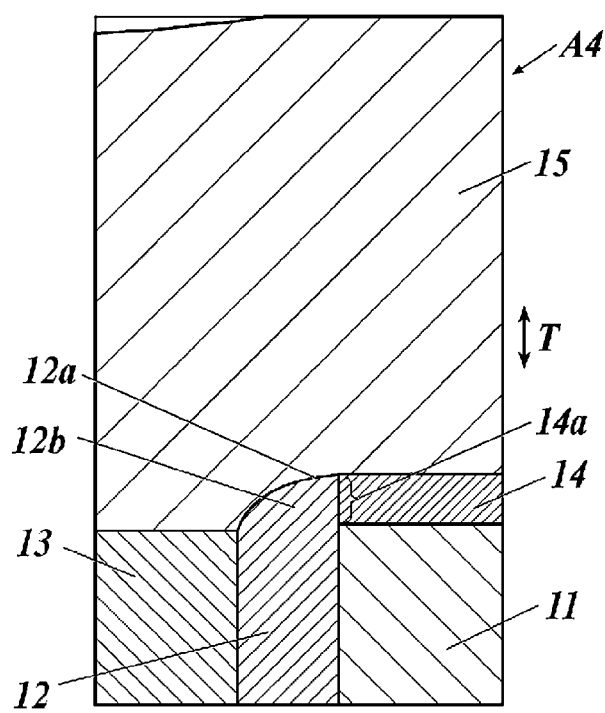
FIG. 9 is an enlarged view corresponding to FIG. 5.

FIG. 6 to FIG. 9 are enlarged views clearly illustrating the structures when the above-described processes are performed. FIG. 6 is an enlarged view corresponding to FIG. 2. FIG. 7 is an enlarged view corresponding to FIG. 3. FIG. 8 is an enlarged view corresponding to FIG. 4. FIG. 9 is an enlarged view corresponding to FIG. 5.

Figure 10:
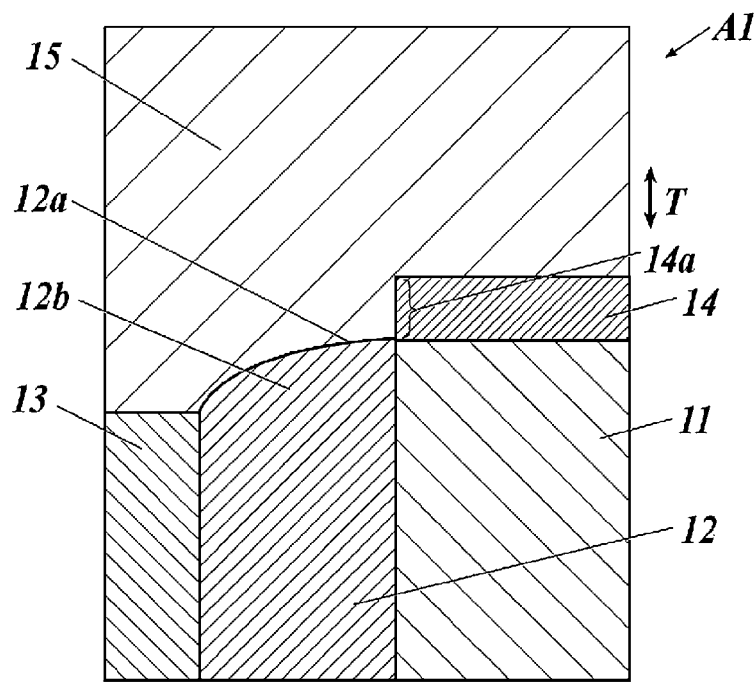
FIG. 10 is a schematic sectional view illustrating a semiconductor device model A1.
Figure 11:
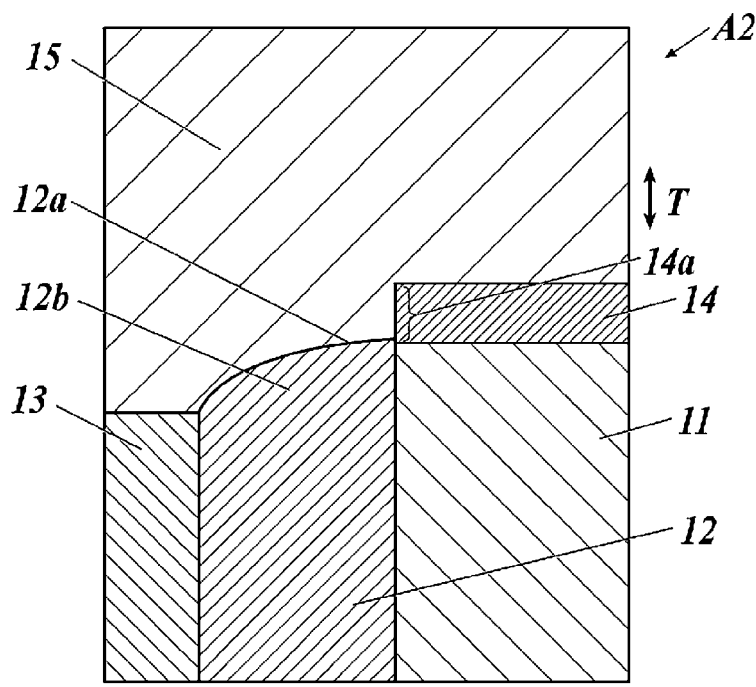
FIG. 11 is a schematic sectional view illustrating a semiconductor device model A2.
Figure 12:
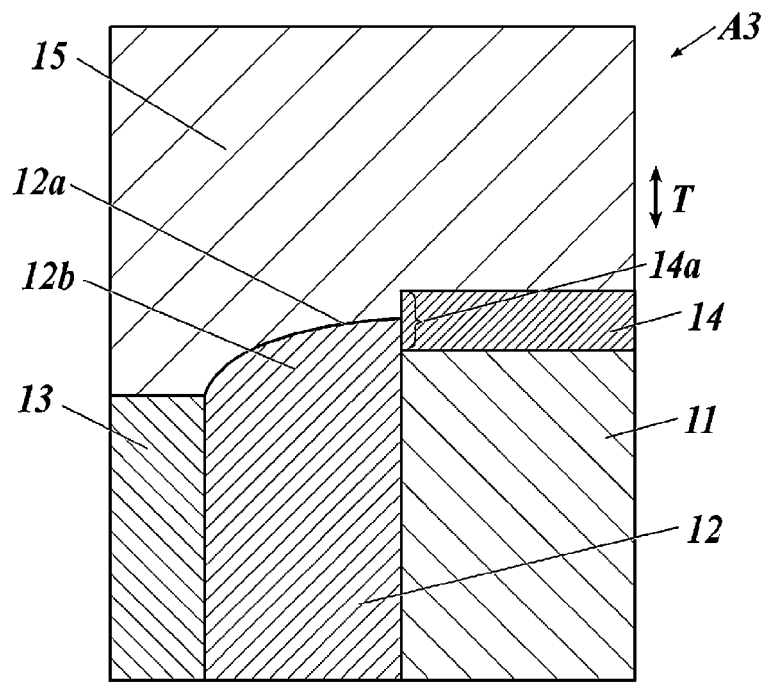
FIG. 12 is a schematic sectional view illustrating a semiconductor device model A3.

The semiconductor device having the structure illustrated in FIG. 5 and FIG. 9 will be referred to as a model A4. Due to the differences in the positional relationship between the semiconductor layer surface 11a and an upper end portion 12b of the insulating film 12, the semiconductor device having the structure illustrated in FIG. 10 will be referred to as a model A1. The semiconductor device having the structure illustrated in FIG. 11 will be referred to as a model A2. The semiconductor device having the structure illustrated in FIG. 12 will be referred to as a model A3. The semiconductor device having the structure illustrated in FIG. 13 will be referred to as a model A5.

Each of the semiconductor device models A1 to A5 includes the semiconductor layer 11 in which the trench 10 has been formed, the insulating film 12 covering the inner surface of the trench 10, the electric conductor 13 embedded in the trench 10, which is covered with the insulating film 12, and the Schottky barrier layer 14 forming a Schottky barrier junction together with the semiconductor layer surface 11a, which is adjacent to the trench 10.

In the semiconductor device model A1, the Schottky barrier junction formed by the semiconductor layer 11 and the Schottky barrier layer 14 is located at the same position as the upper end 12a of the insulating film 12, which covers the inner surface 10a of the trench 10, in the vertical direction. In this structure, the insulating film 12 and the Schottky barrier layer 14 are in point contact with each other as illustrated in the sectional view in FIG. 10. In other words, in this structure, the semiconductor layer 11 and the upper surface electrode 15 are in point contact with each other without the Schottky barrier layer 14 interposed therebetween.

In each of the semiconductor device models A2 to A5, the Schottky barrier junction formed by the semiconductor layer 11 and the Schottky barrier layer 14 is located below the upper end 12a of the insulating film 12 covering the inner surface 10a of the trench 10.

In the model A4, in the process of forming a Schottky barrier junction illustrated in FIG. 8, 100% of the area of an end surface 14a of the Schottky barrier layer 14 forming the Schottky barrier junction is caused to overlap and to be in contact with the upper end portion 12b of the insulating film 12 in a thickness direction T. This is common to the model A5.

Figure 13:
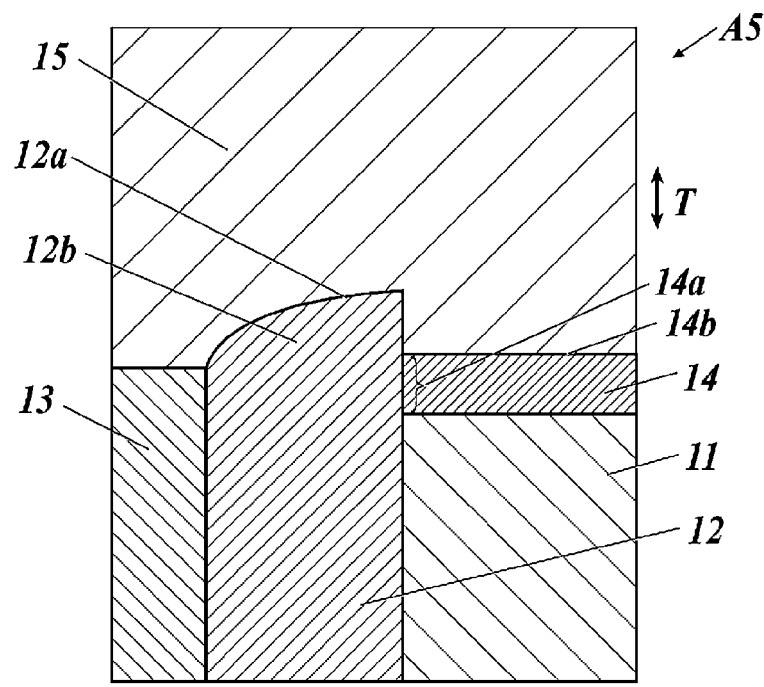
FIG. 13 is a schematic sectional view illustrating a semiconductor device model A5.

As a result, in the model A4 illustrated in FIG. 9 and the model A5 illustrated in FIG. 13, 100% of the area of the end surface 14a of the Schottky barrier layer 14 forming the Schottky barrier junction overlaps and is in contact with the upper end portion 12b of the insulating film 12 in the thickness direction T.

In the model A5, the upper end portion 12b of the insulating film 12 projects in such a manner as to be located above an upper surface of the Schottky barrier layer 14 that is a surface opposite to the surface of the Schottky barrier layer 14 forming the Schottky barrier junction. The semiconductor device having such a structure can be easily manufactured while ensuring 100% overlap amount as the above-mentioned overlapping.

In the process of forming a Schottky barrier junction in the manufacture of the models A3 to A5, a lower area of the end surface 14a of the Schottky barrier layer 14 forming the Schottky barrier junction, the lower area being at least 50% of the end surface 14a, is caused to overlap and to be in contact with the upper end portion 12b of the insulating film 12 in the thickness direction T.

As a result, in the models A3 to A5, a lower area of the end surface 14a of the Schottky barrier layer 14 forming the Schottky barrier junction, the lower area being at least 50% of the end surface 14a, overlaps and is in contact with the upper end portion 12b of the insulating film 12 in the thickness direction T.

In the model A3, the lower area of the end surface 14a of the Schottky barrier layer 14 forming the Schottky barrier junction, the lower area being 50% of the end surface 14a, overlaps and is in contact with the upper end portion 12b of the insulating film 12 in the thickness direction T.

In the process of forming a Schottky barrier junction in the manufacture of the models A2 to A5, the lower area of the end surface 14a of the Schottky barrier layer 14 forming the Schottky barrier junction is caused to overlap and to be in contact with the upper end portion 12b of the insulating film 12 in the thickness direction T.

In the model A2, a small lower area of the end surface 14a of the Schottky barrier layer 14 forming the Schottky barrier junction, the lower area being less than 50% of the end surface 14a, overlaps and is in contact with the upper end portion 12b of the insulating film 12 in the thickness direction T. The overlapping length is, for example, 0.01 μm.

Figure 14:
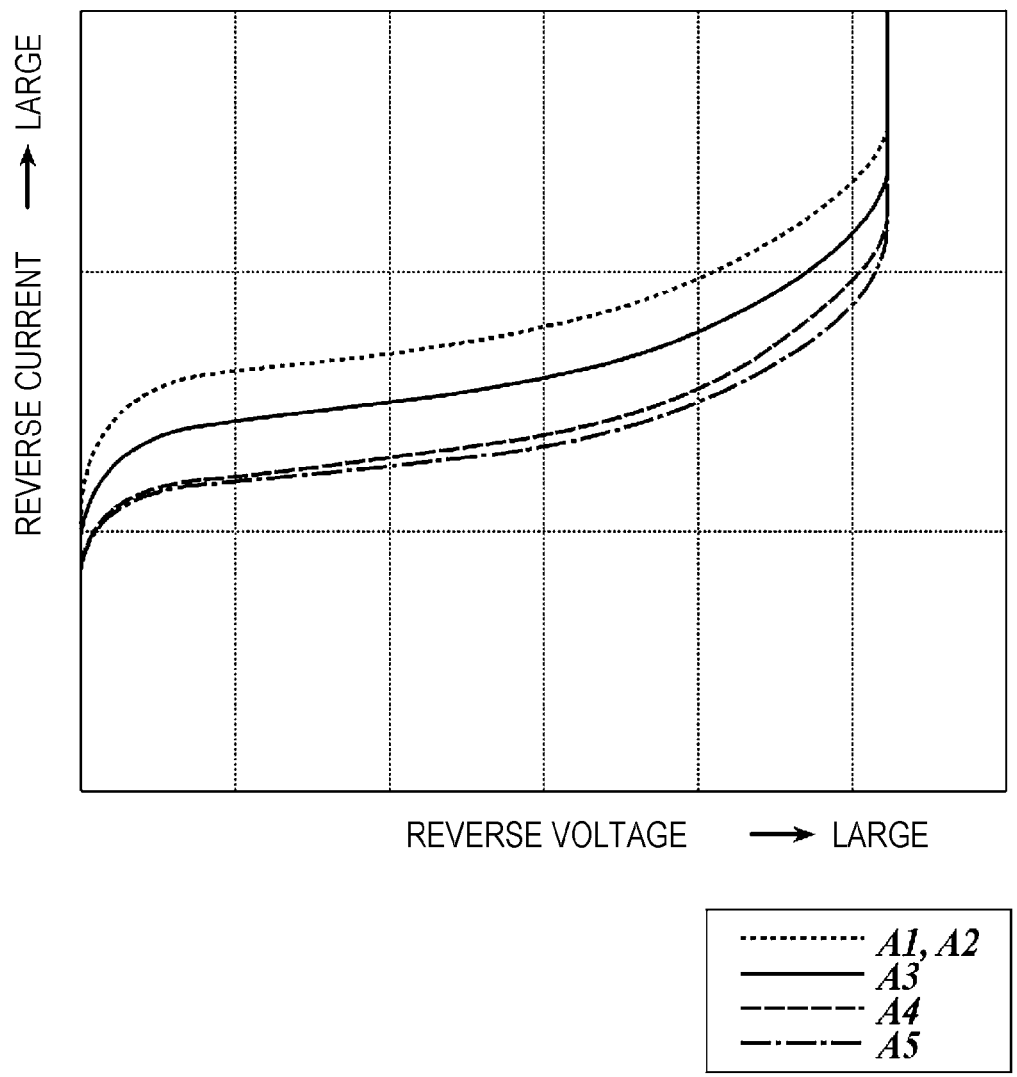
FIG. 14 is a graph illustrating reverse voltage-current characteristics of the models A1 to A5.

The reverse voltage-current characteristics of the Schottky diodes of the above-described models A1 to A5 were examined, and the examination results are illustrated in FIG. 14.

The reverse current was suppressed most in the model A5, followed by the model A4. The difference between the model A4 and the model A5 was small. Each of the models A4 and A5 is a model with 100% overlap amount. A leak current was suppressed presumably because the Schottky barrier junction is isolated from the upper surface electrode 15.

The model A3 was the third most capable of suppressing the reverse current and is a model with 50% overlap amount. The model A2 was the fourth most capable of suppressing the reverse current, and the model A1 was the fifth most capable of suppressing the reverse current. Substantially the same results were obtained from the model A1 and the model A2.

As a result of performing the process of etching a semiconductor layer surface, a remarkable effect of improving the reverse characteristics was observed, and in particular, the overlap amount was 50% or more.

(Silicide)

In the process of forming a Schottky barrier junction, a method is used in which a Schottky barrier junction is formed by a silicide process and in which the Schottky barrier layer 14 forming the Schottky barrier junction is made of silicide.

In other words, the Schottky barrier layer 14 in each of the models A1 to A5 is made of silicide.

(Relationship Between Process of Etching Insulating Film and Process of Etching Semiconductor Layer Surface)

The process of etching a semiconductor layer surface may be performed during the process of etching an insulating film. A wafer having a structure that has not yet undergone the process of etching an insulating film may be placed in an etching chamber, and a gas that etches the semiconductor layer 11 may be added in the later stage of the etching of the insulating film 12, so that the etching of the semiconductor layer 11 may be progressed in the later stage of the progress period of etching the insulating film 12 in such a manner as to etch the semiconductor layer surface 11a.

Alternatively, the process of etching the semiconductor layer surface 11a may be performed after the process of etching the insulating film 12. In this case, the etching of the insulating film 12 and the etching of the semiconductor layer surface 11a may be performed in the same chamber or may be performed in different chambers.

In addition, at a timing after the process of etching an insulating film and before the process of forming a Schottky barrier junction, the semiconductor layer surface 11a may be etched by using an anisotropic etching solution on the wafer surface when performing cleaning before formation of an electrode.

According to the manufacturing method of the above-described embodiment of the present invention, the process of etching a semiconductor layer surface is performed so as to bring the height of the semiconductor layer surface 11a to the same level as the upper end 12a of the insulating film 12 covering the inner surface 10a of the trench 10 or so as to reduce the height of the semiconductor layer surface 11a to be lower than that of the upper end 12a of the insulating film 12. As a result, a leak current that occurs at an edge of the Schottky barrier junction in the vicinity of the end surface 14a of the Schottky barrier layer 14 when a reverse voltage is applied can be reduced so as to be low.

In addition, the insulating film on the semiconductor layer surface 11a can be sufficiently removed, and thus, the Schottky barrier junction having favorable characteristics can be obtained.

According to the semiconductor device of the above-described embodiment of the present invention, a leak current that occurs at an edge of the Schottky barrier junction in the vicinity of the end surface 14a of the Schottky barrier layer 14 when a reverse voltage is applied can be reduced so as to be low.

The insulating film on the semiconductor layer surface 11a is sufficiently removed, and the characteristics of the Schottky barrier junction are favorable.

Although the embodiment of the present disclosure has been described above, the embodiment has been described as an example, and there are various other embodiments available. The components can be omitted, replaced, or changed within the gist of the invention.

INDUSTRIAL APPLICABILITY

The present disclosure can be used for a semiconductor device and a method of manufacturing a semiconductor device.

REFERENCE SIGNS

10 trench
10a inner surface
11 semiconductor layer
11a semiconductor layer surface
12 insulating film
12a upper end
12b upper end portion
13 electric conductor
14 Schottky barrier layer
14a end surface
15 upper surface electrode
A1 to A5 semiconductor device model

The invention claimed is:

1. A semiconductor device comprising:
a semiconductor layer in which a trench has been formed;
an insulating film covering an inner surface of the trench;
an electric conductor embedded in the trench covered with the insulating film; and
a Schottky barrier layer forming a Schottky barrier junction together with a surface of the semiconductor layer adjacent to the trench,
wherein the Schottky barrier junction and the Schottky barrier layer are positioned lower than an upper end of the insulating film covering the inner surface of the trench;
wherein an upper surface electrode is formed above and in direct contact with the top surface of the electric conductor and the Schottky barrier layer.

2. The semiconductor device according to claim 1, wherein a lower area of an end surface of the Schottky barrier layer forming the Schottky barrier junction, the lower area being at least 50% of the end surface, overlaps and is in contact with an upper end portion of the insulating film in a thickness direction.

3. The semiconductor device according to claim 1, wherein 100% of an area of an end surface of the Schottky barrier layer forming the Schottky barrier junction overlaps and is in contact with an upper end portion of the insulating film in a thickness direction.

4. The semiconductor device according to claim 3, wherein the upper end portion of the insulating film projects in such a manner as to be located above an upper surface of the Schottky barrier layer that is a surface opposite to a surface of the Schottky barrier layer forming the Schottky barrier junction.

5. The semiconductor device according to claim 1, wherein the Schottky barrier layer is made of silicide.

* * * * *